United States Patent
Lee et al.

(10) Patent No.: US 9,721,785 B2
(45) Date of Patent: Aug. 1, 2017

(54) METHOD FOR MANUFACTURING SILICA LAYER, SILICA LAYER, AND ELECTRONIC DEVICE

(71) Applicant: SAMSUNG SDI CO., LTD., Yongin-si, Gyeonggi-do (KR)

(72) Inventors: Jiho Lee, Suwon-si (KR); Kunbae Noh, Suwon-si (KR); Huichan Yun, Suwon-si (KR); Jin-Hee Bae, Suwon-si (KR); Wanhee Lim, Suwon-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 0 days.

(21) Appl. No.: 15/178,378

(22) Filed: Jun. 9, 2016

(65) Prior Publication Data

US 2017/0092488 A1 Mar. 30, 2017

(30) Foreign Application Priority Data

Sep. 25, 2015 (KR) .................. 10-2015-0137077

(51) Int. Cl.
*H01L 21/31* (2006.01)
*H01L 21/02* (2006.01)

(52) U.S. Cl.
CPC .. *H01L 21/02164* (2013.01); *H01L 21/02222* (2013.01); *H01L 21/02282* (2013.01); *H01L 21/02307* (2013.01); *H01L 21/02337* (2013.01)

(58) Field of Classification Search
CPC ......... H01L 21/02164; H01L 21/02222; H01L 21/02282; H01L 21/02307; H01L 21/02337

USPC ................. 438/789, 790; 428/1.52
See application file for complete search history.

(56) References Cited

U.S. PATENT DOCUMENTS

| | | | | |
|---|---|---|---|---|
| 2012/0156893 A1* | 6/2012 | Ozaki | ............... | C23C 18/1208 438/781 |
| 2015/0093545 A1* | 4/2015 | Han | ................... | C09D 183/16 428/156 |

FOREIGN PATENT DOCUMENTS

| | | |
|---|---|---|
| JP | 2000-288458 A | 10/2000 |
| JP | 2003-059825 A | 2/2003 |
| JP | 2003-086489 A | 3/2003 |
| JP | 2003-136010 A | 5/2003 |
| JP | 2009-279476 A | 5/2008 |
| JP | 2009-078250 A | 4/2009 |
| JP | 5398307 B2 | 1/2014 |
| KR | 10-2004-0000933 A | 1/2004 |
| KR | 10-0492157 B1 | 6/2005 |
| KR | 10-2009-0045679 A | 5/2009 |
| KR | 10-2010-0098376 A | 9/2010 |
| KR | 10-2013-0105465 A | 9/2013 |
| KR | 10-1491068 B1 | 2/2015 |
| KR | 10-2015-0060126 A | 6/2015 |
| WO | WO 2013-180855 A1 | 12/2013 |

* cited by examiner

*Primary Examiner* — Brook Kebede
(74) *Attorney, Agent, or Firm* — Lewis Roca Rothgerber Christie LLP

(57) ABSTRACT

A method of manufacturing a silica layer includes: coating a pre-wetting liquid material including a carbon compound on a substrate; coating a composition for forming a silica layer on the substrate coated with the pre-wetting liquid material; and curing a substrate coated with the composition for forming a silica layer.

11 Claims, 1 Drawing Sheet

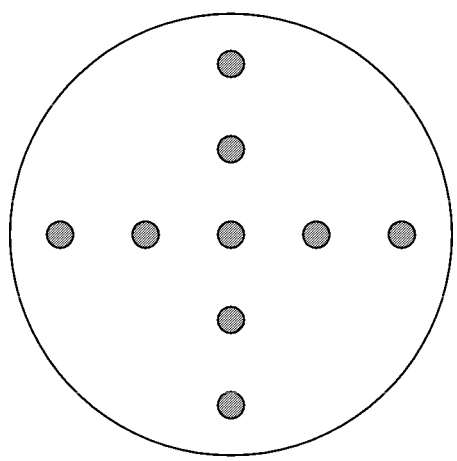

METHOD FOR MANUFACTURING SILICA LAYER, SILICA LAYER, AND ELECTRONIC DEVICE

CROSS-REFERENCE TO RELATED APPLICATION

This application claims priority to and the benefit of Korean Patent Application No. 10-2015-0137077 filed in the Korean Intellectual Property Office on Sep. 25, 2015, the entire contents of which are incorporated herein by reference.

BACKGROUND

1. Field

Embodiments of this disclosure relate to a method for manufacturing a silica layer, a silica layer manufactured therefrom, and an electronic device including the silica layer.

2. Description of the Related Art

A flat panel display uses a thin film transistor (TFT) including a gate electrode, a source electrode, a drain electrode and a semiconductor as a switching device and is equipped with a gate line that transfers a scan signal to control the thin film transistor and a data line that transfers a signal applied to a pixel electrode. In addition, an insulation layer is formed between the semiconductor and the several electrodes to separate them. The insulation layer may be a silica layer including a silicon component. The silica layer may be formed by coating a composition for forming a silica layer on a substrate. When the composition for forming a silica layer in a liquid phase is not well wetted with the substrate in a solid phase, uniformity of the silica layer may be deteriorated. In addition, since the composition is used in a large amount, efficiency of the coating process may be deteriorated when the substrate is not well wetted by the composition for forming the silica layer.

SUMMARY

An embodiment of the present disclosure relates to a method of manufacturing a silica layer having uniformity by using a small amount of a composition for forming a silica layer.

Another embodiment provides a silica layer manufactured according to the method.

Yet another embodiment provides an electronic device including the silica layer.

According to an embodiment, a method of manufacturing a silica layer includes coating a pre-wetting liquid material including a carbon compound on a substrate, coating a composition for forming a silica layer on the substrate coated with the pre-wetting liquid material, and curing the substrate coated with the composition for forming a silica layer.

The carbon compound may include a substituted or unsubstituted benzene ring in the structure, and have an entire carbon number of 6 to 14. For example, a total number of carbon atoms in the carbon compound may be 6 to 14.

The carbon compound may have a boiling point of about 98° C. to about 200° C.

The carbon compound may include a substituted or unsubstituted trimethylbenzene, a substituted or unsubstituted dimethylbenzene, a substituted or unsubstituted diethylbenzene, or a combination thereof.

The composition for forming a silica layer may include a silicon-containing polymer and a solvent.

The silicon-containing polymer may include polysilazane, polysiloxazane, or a combination thereof.

The solvent may include at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone, and a combination thereof.

The coating of the composition for forming a silica layer may be performed using a spin-on coating method.

The curing may be performed at a temperature of greater than or equal to about 150° C. under an atmosphere including inert gas.

According to another embodiment, a silica layer formed by the method of manufacturing a silica layer is provided.

According to yet another embodiment, an electronic device including the silica layer is provided.

Before coating the composition for forming a silica layer, a set (predetermined) pre-treatment of the substrate may be performed, so that the composition for forming a silica layer may be well wetted with the substrate, and the composition in a small amount may be suitably or efficiently coated, thereby forming a uniform or substantially uniform silica layer.

BRIEF DESCRIPTION OF THE DRAWING

The accompanying drawing, together with the specification, illustrates embodiments of the subject matter of the present disclosure, and, together with the description, serves to explain principles of embodiments of the subject matter of the present disclosure. The accompanying drawing is a reference view illustrating an embodiment of a method of evaluating thickness uniformity of a silica layer.

DETAILED DESCRIPTION

Exemplary embodiments of the present disclosure will hereinafter be described in more detail, and may be easily performed by those having ordinary skill in the related art. However, this disclosure may be embodied in many different forms and is not construed as limited to the exemplary embodiments set forth herein.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, it will also be understood that when an element or layer is referred to as being "between" two elements or layers, it can be the only element or layer between the two elements or layers, or one or more intervening elements or layers may also be present.

As used herein, when a definition is not otherwise provided, the term "substituted" refers to one substituted with a substituent selected from a halogen atom (e.g., F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, alkyl group, a C2 to C16 alkenyl group, a C2 to C16 alkynyl group, aryl group, a C7 to C13 arylalkyl group, a C1 to C4 oxyalkyl group, a C1 to C20 heteroalkyl group, a C3 to C20 heteroarylalkyl group, a cycloalkyl group, a C3 to C15 cycloalkenyl group, a C6 to C15 cycloalkynyl group, a heterocycloalkyl group, and a combination thereof, instead of hydrogen of a compound. As used herein, the terms "combination thereof" and "combinations thereof" may refer to a chemical combination (e.g., an alloy or chemical compound), a mixture, or a laminated structure of components.

As used herein, when a definition is not otherwise provided, the term "hetero" refers to one including 1 to 3 heteroatoms selected from N, O, S, and P.

In addition, in the specification, "*" refers to a linking point with the same or different atom or chemical formula.

Hereinafter, a method of manufacturing a silica layer according to an embodiment is described.

A method of manufacturing a silica layer according to one embodiment includes coating a pre-wetting liquid material including a carbon compound on a substrate, coating a composition for forming a silica layer on the substrate coated with the pre-wetting liquid material and curing the substrate coated with the composition for forming a silica layer.

The pre-wetting may include a pre-treatment process performed before the wetting and is referred to as RRC (Reduced resist consumption).

The method of manufacturing a silica layer according to one embodiment includes coating the pre-wetting liquid material including the carbon compound before coating the composition for forming a silica layer on the substrate. Accordingly, the coating of the pre-wetting liquid material may improve coating characteristics of the composition for forming a silica layer such as, for example, wetting characteristics between the substrate, which is a solid, and the composition for forming a silica layer, which is a liquid.

The carbon compound may include a substituted or unsubstituted benzene ring in the structure, and have an entire carbon number of 6 to 14 (e.g., the total number of carbon atoms in the carbon compound may be 6 to 14). When the pre-wetting liquid material including the carbon compound is used, a more uniform thin film may be formed in the following process of coating the composition for forming a silica layer, and the number of hole defects on the surface of the thin film may also be reduced.

For example, in some embodiments, the carbon compound may have a boiling point of about 98° C. to about 200° C., for example about 100° C. to about 180° C. without limitation.

For example, the carbon compound may include one or more selected from a substituted or unsubstituted trimethylbenzene, a substituted or unsubstituted dimethylbenzene, and a substituted or unsubstituted diethylbenzene, but the carbon compound is not limited thereto.

The pre-wetting liquid material may be the carbon compound itself, a mixture of more than two carbon compounds, or a solution including other components in addition to the carbon compound.

The pre-wetting liquid material may be coated, for example, by a method of spin-on coating (e.g., spin coating), slit coating, Inkjet printing, and/or the like without a particular limit.

When the pre-wetting liquid material is completely or substantially completely coated, the composition for forming a silica layer may be coated on the substrate.

The composition for forming a silica layer may include a silicon-containing polymer and a solvent.

The silicon-containing polymer of the composition for forming a silica layer may include a moiety represented by Chemical Formula 1.

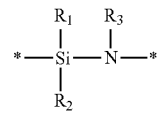

Chemical Formula 1

In Chemical Formula 1, $R_1$ to $R_3$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, substituted or unsubstituted alkoxy group, a carboxyl group, an aldehyde group, a hydroxy group, or a combination thereof, and "*" indicates a linking point.

For example, the silicon-containing polymer may be polysilazane prepared by reacting halosilane with ammonia.

For example, the silicon-containing polymer of the composition for forming a silica layer may further include a moiety represented by Chemical Formula 2 in addition to the moiety of Chemical Formula 1.

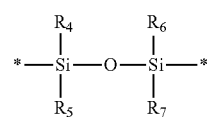

Chemical Formula 2

In Chemical Formula 2, $R_4$ to $R_7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, substituted or unsubstituted alkoxy group, a carboxyl group, an aldehyde group, a hydroxy group, or a combination thereof,

* indicates a linking point.

Herein, the silicon-containing polymer includes a silicon-oxygen-silicon (Si—O—Si) bond moiety in addition to a silicon-nitrogen (Si—N) bond moiety in the structure, and the silicon-oxygen-silicon (Si—O—Si) bond moiety may alleviate a stress during the curing through a heat treatment and thus reduce a contraction (e.g., contraction of the silica layer).

For example, the silicon-containing polymer may include the moiety represented by Chemical Formula 1, the moiety represented by Chemical Formula 2, and may further include a moiety represented by Chemical Formula 3.

*—SiH$_3$                  Chemical Formula 3

The moiety represented by Chemical Formula 3 is a structure where the terminal end is capped with hydrogen, and may be included in an amount of about 15 to about 35 wt % based on the total amount of the Si—H bond of the silicon-containing polymer (e.g., the polysilazane or polysiloxazane structure). When the moiety of Chemical Formula 3 is included in the polysilazane or polysiloxazane structure within the range, a $SiH_3$ moiety is prevented from being scattered into $SiH_4$ (e.g., an amount of the $SiH_3$ moiety that is decomposed or reacted to form $SiH_4$ is reduced) while an oxidation reaction suitably or sufficiently occurs during the heat treatment, and a crack in a filler pattern may be prevented or reduced.

The silicon-containing polymer may be included in an amount of about 0.1 to about 50 wt %, for example about 0.1 to about 30 wt % based on the total amount of the composition for forming a silica layer. When the silicon-containing polymer is included within the range, it may maintain a suitable or appropriate viscosity and bring about a flat and uniform or substantially uniform layer with no or substantially no gap (e.g., no or substantially no voids).

The solvent of the composition for forming a silica layer may be any suitable solvent in which the silicon-containing polymer is soluble without limitation, and may include, for example, at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone and a combination thereof.

The composition for forming a silica layer may further include a thermal acid generator (TAG).

The thermal acid generator may be an additive to improve developing a property of the composition for forming a silica layer, and thus makes the silicon-containing polymer of the composition be developed at a relatively low temperature.

The thermal acid generator may include any suitable compound without particular limit, if it generates acid (e.g., $H^+$) by heat. For example, it may include a compound activated at 90° C. or higher and generating suitable or sufficient acid and also, having low volatility.

The thermal acid generator may be, for example selected from nitrobenzyl tosylate, nitrobenzyl benzenesulfonate, phenol sulfonate, and a combination thereof.

The thermal acid generator may be included in an amount of about 0.01 to about 25 wt % based on the total amount of the composition for forming a silica layer. Within the range, the polymer may be developed at a low temperature and concurrently (e.g., simultaneously), have improved coating properties.

The composition for forming a silica layer may further include a surfactant.

The surfactant is not particularly limited, and may be, for example a non-ionic surfactant such as polyoxyethylene alkyl ethers such as polyoxyethylene lauryl ether, polyoxyethylene stearyl ether, polyoxyethylene cetyl ether, polyoxyethylene oleyl ether, and the like, polyoxyethylene alkylallyl ethers such as polyoxyethylenenonyl phenol ether, and the like, polyoxyethylene.polyoxypropylene block copolymers, polyoxyethylene sorbitan fatty acid ester such as sorbitan monolaurate, sorbitan monopalmitate, sorbitan monostearate, sorbitan monooleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactant such as a organosiloxane polymer KP341 (Shin-Etsu Chemical Co., Ltd.), and the like.

The surfactant may be included in an amount of about 0.001 to about 10 wt % based on the total amount of the composition for forming a silica layer. Within the range, dispersion of a solution and concurrently (e.g., simultaneously), uniform or substantially uniform thickness of a layer may be improved.

The composition for forming a silica layer may be coated through a solution process, for example, spin-on coating (e.g., spin coating), slit coating, inkjet printing, and/or the like.

The substrate may be, for example a device substrate such as a semiconductor, a liquid crystal and the like, but the substrate is not limited thereto.

When the composition for forming a silica layer is completely or substantially completely coated, the substrate is subsequently dried and cured. The curing may be, for example, performed at a temperature greater than or equal to about 150° C. under an atmosphere including inert gas (e.g., helium, argon, etc.) by applying, for example, energy such as heat, ultraviolet (UV), a microwave, a sound wave, an ultrasonic wave, or the like Embodiments of the method of manufacturing a silica layer uniformly coat the composition for forming a silica layer in a relatively smaller amount on the substrate according to the following spin-on coating method by coating the pre-wetting liquid material including the carbon compound before coating the composition for forming a silica layer.

The pre-wetting liquid material (e.g., a pre-wetting solution-phased material) including the carbon compound may suppress or reduce generation of gas when a component included in the composition for forming a silica layer, for example, polysilazane contacts with air (e.g., oxygen) or moisture in the air and eases the physical behavior of the composition for forming a silica layer, when the composition for forming a silica layer is coated on the substrate, and thus, the pre-wetting liquid material including the carbon compound minimizes or reduces permeation of the air into the silica layer.

Accordingly, the number of hole defects on the surface of the final silica layer may be reduced.

According to another embodiment, a silica layer manufactured by the method described above is provided. The silica layer may be, for example an insulation layer, a separation layer, and/or a protective layer such as a hard coating layer, but the silica layer is not limited thereto.

According to yet another embodiment, an electronic device including the silica layer manufactured by embodiments of the method described above is provided. The electronic device may be, for example, a display device such as LCD or LED, or a semiconductor device.

The following examples illustrate embodiments of the present disclosure in more detail. However, these examples are exemplary, and the present disclosure is not limited thereto.

Preparation Example: Composition for Silica Layer

A 2 L reactor equipped with an agitator and a temperature controller was internally substituted (purged) with dry nitrogen. Subsequently, 1,500 g of dry pyridine was injected thereinto, sufficiently mixed, and kept warm at 20° C. Subsequently, 100 g of dichlorosilane was slowly injected thereinto over one hour. Then, 70 g of ammonia was slowly injected thereinto over 3 hours, while the reactor was agitated. Subsequently, dry nitrogen was injected thereinto for 30 minutes, and the ammonia remaining in the reactor was removed. The white slurry-phased product was filtered utilizing a 1 μm Teflon filter under a dry nitrogen atmosphere, thereby obtaining 1,000 g of a filtered solution. Then, 1,000 g of dry xylene was added thereto, and the mixture was adjusted to have a solid concentration of 20% by repetitively, three times in total, substituting xylene for the pyridine with a rotary evaporator and then, filtered utilizing a Teflon filter having a pore size of 0.03 μm. The obtained polysilazane had an oxygen content of 3.8%, $SiH_3/SiH$ (total) of 0.22, and a weight average molecular weight of 4,000.

The polysilazane was mixed with dibutylether (DBE), thereby preparing a composition for forming a silica layer having a solid content of 15±0.1 wt %.

EXAMPLE 1

3.0 ml of trimethylbenzene (TMB) as a pre-wetting liquid material was spin-coated in the center of a silicon wafer having a diameter of 12 inches at 2000 rpm for 20 seconds with a spin-coater (MS-A200, MIKASA Co., Ltd.), and then, 3.0 ml of the composition for forming a silica layer according to the Preparation Example was spin-coated thereon under the same or substantially the same conditions and then, heated on a hot plate at 150° C. for 3 minutes, thereby forming a thin film.

EXAMPLE 2

A thin film was formed according to the same method as described with respect to Example 1 except for using 3.0 ml of a mixed solution of trimethylbenzene (TMB) as a pre-wetting liquid material and dibutylether (DBE) mixed in a mass ratio of 7:3.

EXAMPLE 3

A thin film was formed according to the same method as described with respect to Example 1 except for using dibutylether (DBE) as a pre-wetting liquid material.

COMPARATIVE EXAMPLE 1

A thin film was formed according to the same method as described with respect to Example 1 except for not coating the pre-wetting liquid material.

Evaluation 1: Uniformity of Film Thickness

The average thickness, thickness range (e.g., maximum thickness to minimum thickness, which was used to calculate that maximum thickness minus the minimum thickness), and thickness uniformity of the thin films according to Examples 1 to 3 and Comparative Example 1 were evaluated by designating 9 cross (+)-shaped points by using a reflectance spectrometery-type film thickness meter (ST-5000) made by K-MAC on a wafer as shown in the accompanying drawing.

The film thickness uniformity is evaluated according to the following equation 1.

Thickness uniformity=[(maximum thickness−minimum thickness)/(2*average thickness)]*100    Equation 1

The results are provided in Table 1.

TABLE 1

|  | Average thickness (Å) | Maximum thickness − minimum thickness (Å) | Thickness uniformity |
| --- | --- | --- | --- |
| Comparative Example 1 | 5954 | 167 | 1.4 |
| Example 1 | 5964 | 87 | 0.7 |
| Example 2 | 5958 | 58 | 0.5 |
| Example 3 | 5977 | 102 | 0.9 |

Referring to Table 1, the thin films treated through a set (predetermined) pre-wetting process according to Examples 1 to 3 had more thickness uniformity (were more uniform) than the film having no pre-wetting process according to Comparative Example 1.

EXAMPLES 4 TO 6 AND COMPARATIVE EXAMPLE 2

The thin films prepared according to Examples 1 to 3 and Comparative Example 1, after evaluating the film thickness uniformity, were respectively oxidized at a high temperature of about 800° C. and converted into oxidation layers and then, etched, thereby forming each silica layer.

Evaluation 2: Hole Defect of Silica Layer

The silica layers prepared according to Examples 4 to 6 and Comparative Example 2 were examined regarding a defect by using AIT XP (AIT XP Fusion, KLA-Tencor Corp.) and an electron microscope (S5500, Hitachi Ltd.). The spherically-shaped defects having a diameter of greater than or equal to about 150 nm on the pattern out of the total defects were counted and regarded as a hole defect.

The results of the defect analysis are provided in Table 2.

TABLE 2

|  | Comparative Example 2 | Example 4 | Example 5 | Example 6 |
| --- | --- | --- | --- | --- |
| The number of total defects | 174 | 94 | 64 | 156 |
| The number of hole defects | 41 | 1 | 0 | 2 |
| Hole defect ratio (%) | 23.56 | 1.06 | 0.00 | 1.28 |

Referring to Table 2, the silica layers formed through a set (predetermined) pre-wetting process according to Examples 4 to 6 showed relatively fewer total defects and, for example, fewer hole defects than the silica layer having no pre-wetting process prepared according to Comparative Example 2.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of this disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims, and equivalents thereof.

What is claimed is:

1. A method of manufacturing a silica layer, the method comprising:

coating a pre-wetting liquid material comprising a carbon compound on a substrate;

coating a composition for forming a silica layer on the substrate coated with the pre-wetting liquid material; and curing a substrate coated with the composition for forming a silica layer.

2. The method of claim 1, wherein the carbon compound comprises a substituted or unsubstituted benzene ring in the structure and the total number of carbon atoms of the carbon compound is 6 to 14.

3. The method of claim 1, wherein the carbon compound has a boiling point of about 98° C. to about 200° C.

4. The method of claim 1, wherein the carbon compound comprises a substituted or unsubstituted trimethylbenzene, a substituted or unsubstituted dimethylbenzene, a substituted or unsubstituted diethylbenzene, or a combination thereof.

5. The method of claim 1, wherein the composition for forming a silica layer comprises a silicon-containing polymer and a solvent.

6. The method of claim 5, wherein the silicon-containing polymer comprises polysilazane, polysiloxazane, or a combination thereof.

7. The method of claim 5, the solvent comprises at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone, and a combination thereof.

8. The method of claim 1, wherein the composition for forming a silica layer is coated using a spin-on coating method.

9. The method of claim 1, wherein the curing is performed a temperature of greater than or equal to about 150° C. under an atmosphere comprising an inert gas.

10. A silica layer manufactured by the method of claim 1.

11. An electronic device comprising the silica layer of claim 10.

* * * * *